(12) United States Patent
Suyama

(10) Patent No.: US 11,165,498 B2
(45) Date of Patent: Nov. 2, 2021

(54) POWER OVER FIBER SYSTEM

(71) Applicant: KYOCERA CORPORATION, Kyoto (JP)

(72) Inventor: Takehiko Suyama, Yamato (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/259,550

(22) PCT Filed: May 21, 2020

(86) PCT No.: PCT/JP2020/020035
§ 371 (c)(1),
(2) Date: Jan. 12, 2021

(87) PCT Pub. No.: WO2021/014727
PCT Pub. Date: Jan. 28, 2021

(65) Prior Publication Data
US 2021/0184769 A1 Jun. 17, 2021

(30) Foreign Application Priority Data
Jul. 22, 2019 (JP) .............................. JP2019-134235

(51) Int. Cl.
*H04B 10/61* (2013.01)
*H04B 10/25* (2013.01)
(Continued)

(52) U.S. Cl.
CPC ......... *H04B 10/2589* (2020.05); *H01S 5/042* (2013.01); *H04B 10/503* (2013.01); *H04B 10/61* (2013.01)

(58) Field of Classification Search
CPC ...... H04B 10/80; H04B 10/503; H04B 10/61; H04B 10/2589; H01S 5/042
See application file for complete search history.

(56) References Cited

U.S. PATENT DOCUMENTS

| 7,965,948 B1 * | 6/2011 | Bugash ................ H04B 10/807 398/197 |
| 2004/0012844 A1 * | 1/2004 | Ohtsuki .............. G03F 7/70575 359/341.1 |

(Continued)

FOREIGN PATENT DOCUMENTS

| CN | 103633924 A | 3/2014 |
| JP | 2000324726 A | 11/2000 |

(Continued)

*Primary Examiner* — Dzung D Tran
(74) *Attorney, Agent, or Firm* — Hauptman Ham, LLP

(57) ABSTRACT

A power over fiber system includes: a power sourcing equipment, a powered device, an optical fiber cable, a temperature sensor and a controller. The power sourcing equipment includes a semiconductor laser that oscillates with electric power, thereby outputting feed light. The powered device includes a photoelectric conversion element that converts the feed light from the power sourcing equipment into electric power. The optical fiber cable transmits the feed light from the power sourcing equipment to the powered device. The temperature sensor detects a temperature of the photoelectric conversion element. The controller performs a process of lowering an output level of the feed light in response to the temperature detected by the temperature sensor being equal to or higher than a predetermined threshold value, and performs a process of raising the output level of the feed light in response to the temperature being lower than the predetermined threshold value.

12 Claims, 5 Drawing Sheets

(51) Int. Cl.
  *H01S 5/042* (2006.01)
  *H04B 10/50* (2013.01)

(56) References Cited

U.S. PATENT DOCUMENTS

| | | | |
|---|---|---|---|
| 2007/0121683 A1* | 5/2007 | Haasteren | H01S 5/06832 |
| | | | 372/20 |
| 2016/0121009 A1* | 5/2016 | Farr | G02B 19/0019 |
| | | | 250/492.1 |
| 2017/0272157 A1* | 9/2017 | Crowne | G01D 21/02 |
| 2018/0227133 A1 | 8/2018 | Yang et al. | |
| 2020/0085285 A1* | 3/2020 | Yamada | A61B 5/0075 |

FOREIGN PATENT DOCUMENTS

| | | |
|---|---|---|
| JP | 2000350387 A | 12/2000 |
| JP | 2010135989 A | 6/2010 |
| JP | 6534999 B2 | 6/2019 |

\* cited by examiner

POWER OVER FIBER SYSTEM

RELATED APPLICATIONS

The present application is a National Phase of International Application Number PCT/JP2020/020035 filed May 21, 2020 and claims priority to Japanese Application Number 2019-134235 filed Jul. 22, 2019.

TECHNICAL FIELD

The present disclosure relates to optical power supply.

BACKGROUND ART

Recently, there has been studied an optical power supply system that converts electric power into light (called feed light), transmits the feed light, converts the feed light into electric energy, and uses the electric energy as electric power.

There is disclosed in Patent Literature 1 an optical communication device that includes: an optical transmitter that transmits signal light modulated with an electric signal and feed light for supplying electric power; an optical fiber including a core that transmits the signal light, a first cladding that is formed around the core, has a refractive index lower than that of the core, and transmits the feed light, and a second cladding that is formed around the first cladding, and has a refractive index lower than that of the first cladding; and an optical receiver that operates with electric power obtained by converting the feed light transmitted through the first cladding of the optical fiber, and converts the signal light transmitted through the core of the optical fiber into the electric signal.

CITATION LIST

Patent Literature

Patent Literature 1: JP 2010-135989 A

SUMMARY OF INVENTION

Problem to Solve

In a case where, in a power over fiber system, an optical transmitter transmits feed light at a constant output to supply power to an optical receiver, even when power consumption in the optical receiver is reduced, the feed light continues to be supplied to the optical receiver, so that a surplus of electric energy may be lost as heat. Reduction of such energy loss is required.

Solution to Problem

A power over fiber system according to an aspect of the present disclosure includes:

a power sourcing equipment including a semiconductor laser that oscillates with electric power, thereby outputting feed light;

a powered device including a photoelectric conversion element that converts the feed light from the power sourcing equipment into electric power;

an optical fiber cable that transmits the feed light from the power sourcing equipment to the powered device;

a temperature sensor that detects a temperature of the photoelectric conversion element; and a controller that performs a process of lowering an output level of the feed light in response to the temperature detected by the temperature sensor being equal to or higher than a predetermined threshold value, and performs a process of raising the output level of the feed light in response to the temperature being lower than the predetermined threshold value.

The power over fiber system includes:

a first data communication device including the power sourcing equipment; and a second data communication device including the powered device and performing optical communication with the first data communication device, wherein the controller includes: a power-receiving-side controller that is included in the second data communication device and obtains temperature information on the temperature detected by the temperature sensor; and a power-supplying-side controller that is included in the first data communication device and performs a process of, in accordance with the temperature information obtained by the power-receiving-side controller, switching the output level of the feed light that is output by the semiconductor laser.

DESCRIPTION OF EMBODIMENTS

Hereinafter, embodiments of the present disclosure will be described with reference to the drawings.

(1) Outline of System

First Embodiment

Figure 1:
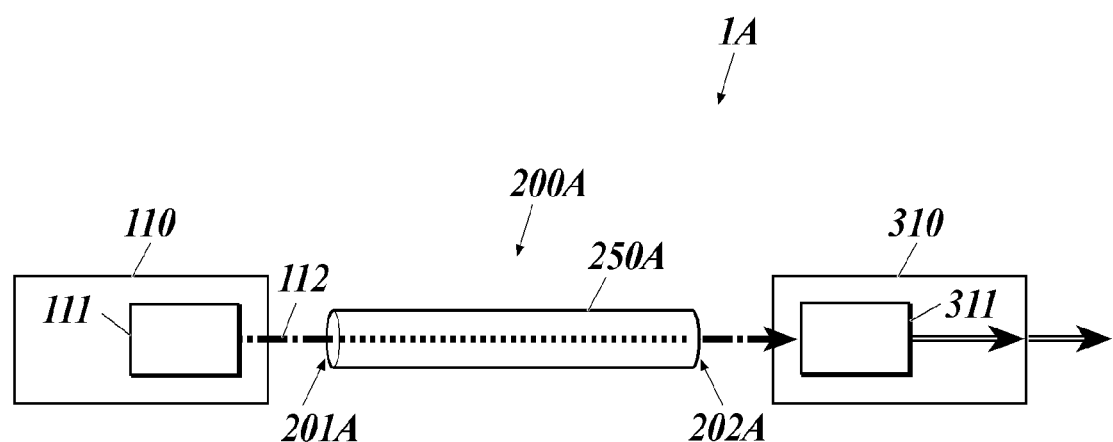
FIG. 1 is a block diagram of a power over fiber system according to a first embodiment of the present disclosure.

As shown in FIG. 1, a power over fiber (PoF) system 1A (optical power supply system) of this embodiment includes a power sourcing equipment (PSE) 110, an optical fiber cable 200A and a powered device (PD) 310.

In the present disclosure, a power sourcing equipment converts electric power into optical energy and supplies (sources) the optical energy, and a powered device receives (draws) the supplied optical energy and converts the optical energy into electric power.

The power sourcing equipment 110 includes a semiconductor laser 111 for power supply.

The optical fiber cable 200A includes an optical fiber 250A that forms a transmission path of feed light.

The powered device 310 includes a photoelectric conversion element 311.

The power sourcing equipment 110 is connected to a power source, and electrically drives the semiconductor laser 111 and so forth.

The semiconductor laser 111 oscillates with the electric power from the power source, thereby outputting feed light 112.

The optical fiber cable 200A has one end 201A connectable to the power sourcing equipment 110 and the other end 202A connectable to the powered device 310 to transmit the feed light 112.

The feed light 112 from the power sourcing equipment 110 is input to the one end 201A of the optical fiber cable 200A, propagates through the optical fiber 250A, and is output from the other end 202A of the optical fiber cable 200A to the powered device 310.

The photoelectric conversion element 311 converts the feed light 112 transmitted through the optical fiber cable 200A into electric power. The electric power obtained by the conversion of the feed light 112 by the photoelectric conversion element 311 is driving power needed in the powered device 310. The powered device 310 is capable of outputting, for an external device(s), the electric power obtained by the conversion of the feed light 112 by the photoelectric conversion element 311.

Semiconductor materials of semiconductor regions of the semiconductor laser 111 and the photoelectric conversion element 311 are semiconductors having a laser wavelength being a short wavelength of 500 nm or less. The semiconductor regions exhibit light-electricity conversion effect.

Semiconductors having a laser wavelength being a short wavelength have a large band gap and a high photoelectric conversion efficiency, and hence improve photoelectric conversion efficiency at the power supplying side and the power receiving side in optical power supply, and improve optical power supply efficiency.

Hence, as the semiconductor materials, laser media having a laser wavelength (base wave) of 200 nm to 500 nm may be used. Examples thereof include diamond, gallium oxide, aluminum nitride and gallium nitride.

Further, as the semiconductor materials, semiconductors having a band gap of 2.4 eV or greater are used.

For example, laser media having a band gap of 2.4 eV to 6.2 eV may be used. Examples thereof include diamond, gallium oxide, aluminum nitride and gallium nitride.

Laser light having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used as the semiconductor materials, whereas when the photoelectric conversion efficiency is given priority, laser media having a laser wavelength (base wave) of less than 200 nm may be used as the semiconductor materials.

Any of these semiconductor materials may be used in one of the semiconductor laser 111 and the photoelectric conversion element 311. This improves the photoelectric conversion efficiency at either the power supplying side or the power receiving side, and improves the optical power supply efficiency.

Second Embodiment

Figure 2:
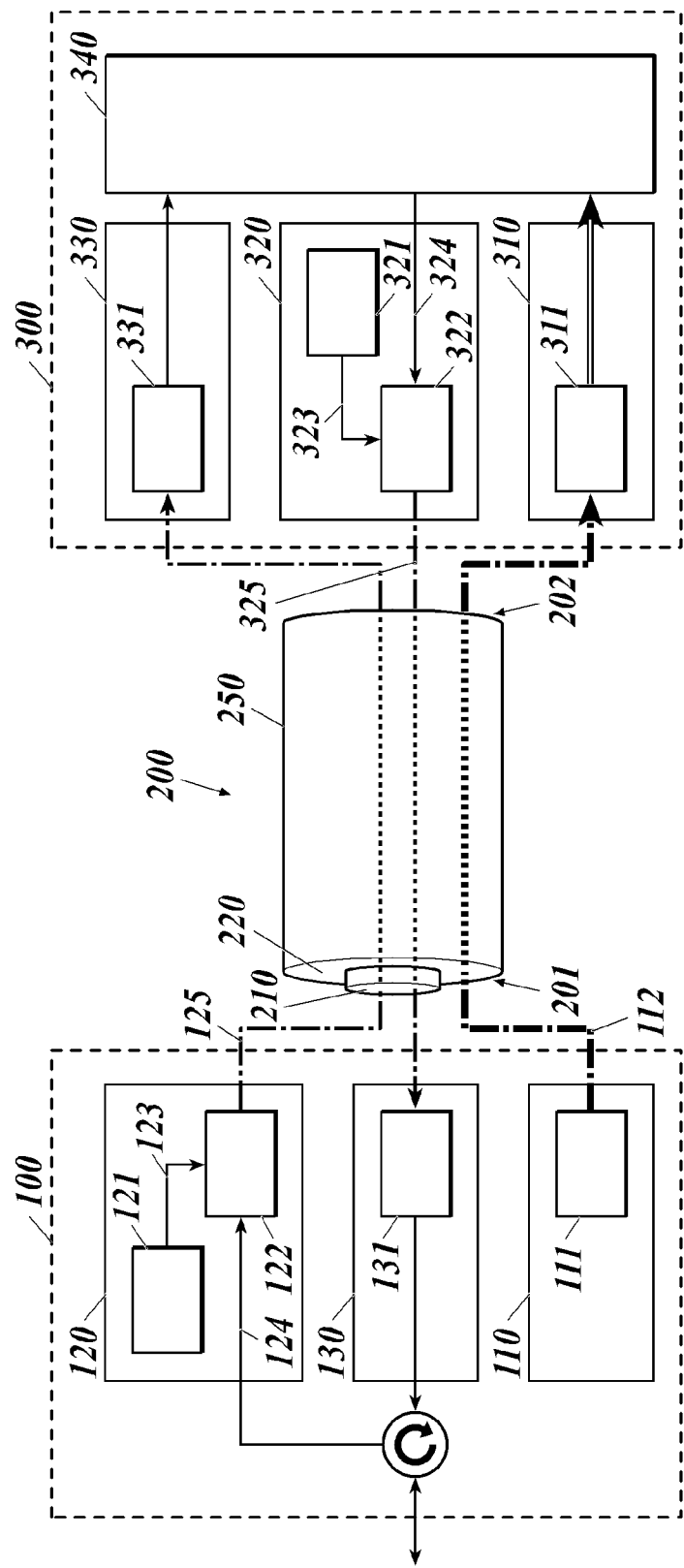
FIG. 2 is a block diagram of a power over fiber system according to a second embodiment of the present disclosure.

As shown in FIG. 2, a power over fiber (PoF) system 1 of this embodiment includes a power supply system through an optical fiber and an optical communication system therethrough, and includes: a first data communication device 100 including a power sourcing equipment (PSE) 110; an optical fiber cable 200; and a second data communication device 300 including a powered device (PD) 310.

The power sourcing equipment 110 includes a semiconductor laser 111 for power supply. The first data communication device 100 includes, in addition to the power sourcing equipment 110, a transmitter 120 and a receiver 130 for data communication. The first data communication device 100 corresponds to a data terminal equipment (DTE), a repeater or the like. The transmitter 120 includes a semiconductor laser 121 for signals and a modulator 122. The receiver 130 includes a photodiode 131 for signals.

The optical fiber cable 200 includes an optical fiber 250 including: a core 210 that forms a transmission path of signal light; and a cladding 220 that is arranged so as to surround the core 210 and forms a transmission path of feed light.

The powered device 310 includes a photoelectric conversion element 311. The second data communication device 300 includes, in addition to the powered device 310, a transmitter 320, a receiver 330 and a data processing unit 340. The second data communication device 300 corresponds to a power end station or the like. The transmitter 320 includes a semiconductor laser 321 for signals and a modulator 322. The receiver 330 includes a photodiode 331 for signals. The data processing unit 340 processes received signals. The second data communication device 300 is a node in a communication network. The second data communication device 300 may be a node that communicates with another node.

The first data communication device 100 is connected to a power source, and electrically drives the semiconductor laser 111, the semiconductor laser 121, the modulator 122, the photodiode 131 and so forth. The first data communication device 100 is a node in a communication network. The first data communication device 100 may be a node that communicates with another node.

The semiconductor laser 111 oscillates with the electric power from the power source, thereby outputting feed light 112.

The photoelectric conversion element 311 converts the feed light 112 transmitted through the optical fiber cable 200 into electric power. The electric power obtained by the conversion of the feed light 112 by the photoelectric conversion element 311 is driving power needed in the second data communication device 300, for example, driving power for the transmitter 320, the receiver 330 and the data processing unit 340. The second data communication device 300 may be capable of outputting, for an external device(s), the electric power obtained by the conversion of the feed light 112 by the photoelectric conversion element 311.

The modulator 122 of the transmitter 120 modulates laser light 123 output by the semiconductor laser 121 to signal light 125 on the basis of transmission data 124, and outputs the signal light 125.

The photodiode 331 of the receiver 330 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as transmission data 324.

The modulator 322 of the transmitter 320 modulates laser light 323 output by the semiconductor laser 321 to signal light 325 on the basis of the transmission data 324, and outputs the signal light 325.

The photodiode 131 of the receiver 130 demodulates the signal light 325 transmitted through the optical fiber cable 200 to an electric signal, and outputs the electric signal. Data of the electric signal is transmitted to a node, whereas data from the node is the transmission data 124.

The feed light 112 and the signal light 125 from the first data communication device 100 are input to one end 201 of the optical fiber cable 200, propagate through the cladding 220 and the core 210, respectively, and are output from the other end 202 of the optical fiber cable 200 to the second data communication device 300.

The signal light 325 from the second data communication device 300 is input to the other end 202 of the optical fiber cable 200, propagates through the core 210, and is output from the one end 201 of the optical fiber cable 200 to the first data communication device 100.

Figure 3:
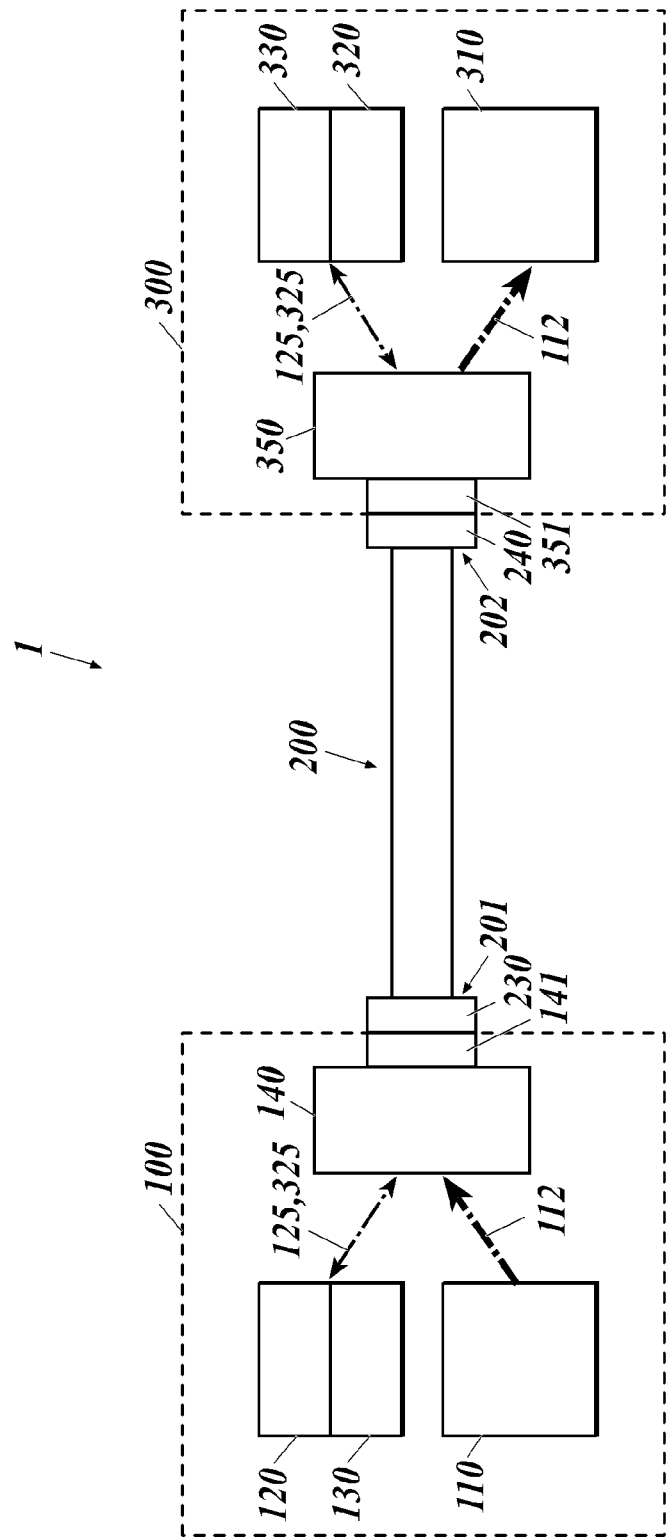
FIG. 3 is a block diagram of the power over fiber system according to the second embodiment of the present disclosure and shows optical connectors and so forth.

As shown in FIG. 3, the first data communication device 100 includes a light input/output part 140 and an optical connector 141 attached to the light input/output part 140, and the second data communication device 300 includes a light input/output part 350 and an optical connector 351 attached to the light input/output part 350. An optical connector 230 provided at the one end 201 of the optical fiber cable 200 is connected to the optical connector 141, and an optical connector 240 provided at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300 to transmit the feed light 112. In this embodiment, the optical fiber cable 200 transmits the signal light 125/325 bidirectionally.

As the semiconductor materials of the semiconductor regions, which exhibit the light-electricity conversion effect, of the semiconductor laser 111 and the photoelectric conversion element 311, any of those described in the first embodiment can be used, thereby achieving a high optical power supply efficiency.

Figure 4:
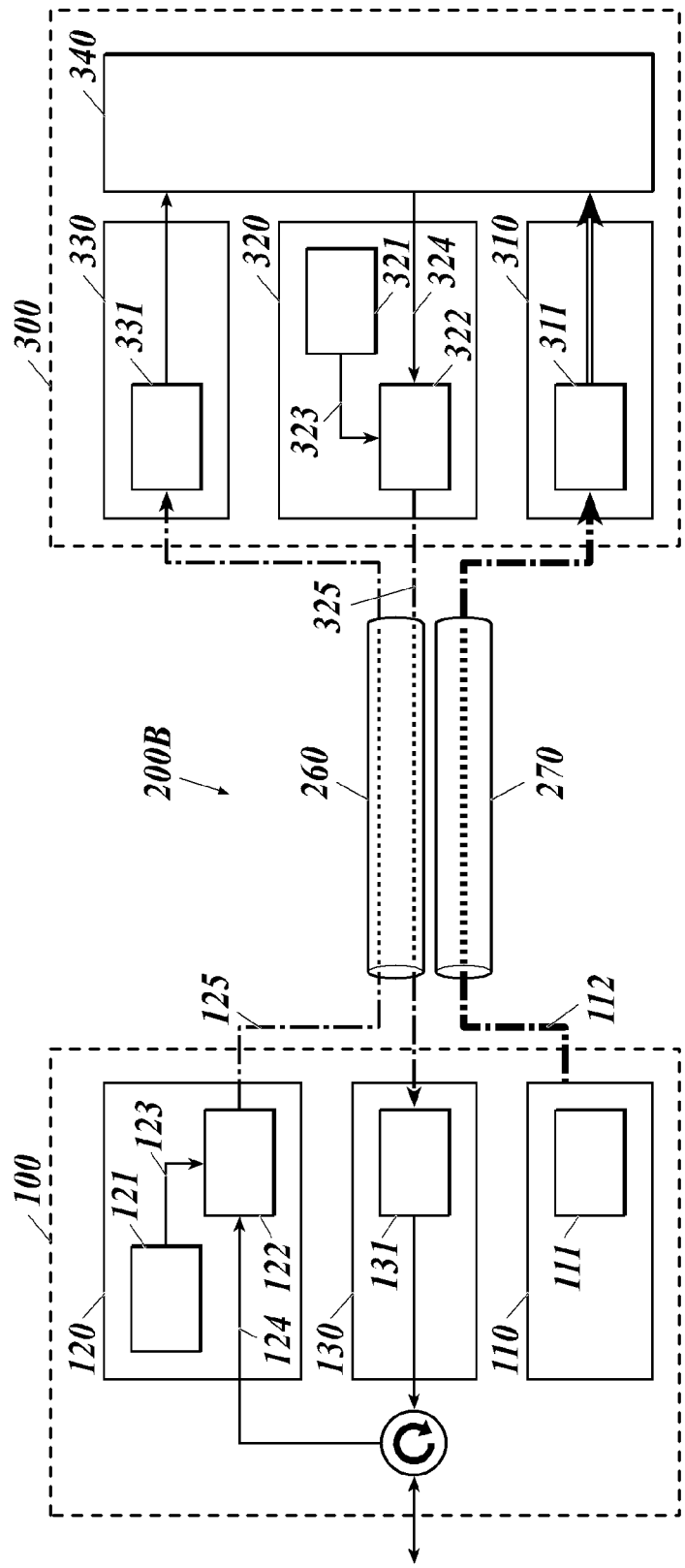
FIG. 4 is a block diagram of a power over fiber system according to another embodiment of the present disclosure.

Like an optical fiber cable 200B of a power over fiber system 1B shown in FIG. 4, an optical fiber 260 that transmits signal light and an optical fiber 270 that transmits feed light may be provided separately. Further, the optical fiber cable 200B may be composed of a plurality of optical fiber cables.

(2) Switching of Output Level of Feed Light

Next, a process of switching an output level of the feed light 112 according to change in temperature of the photoelectric conversion element 311 of the powered device 310, the feed light 112 being output by the semiconductor laser 111 of the power sourcing equipment 110, will be described.

Figure 5:
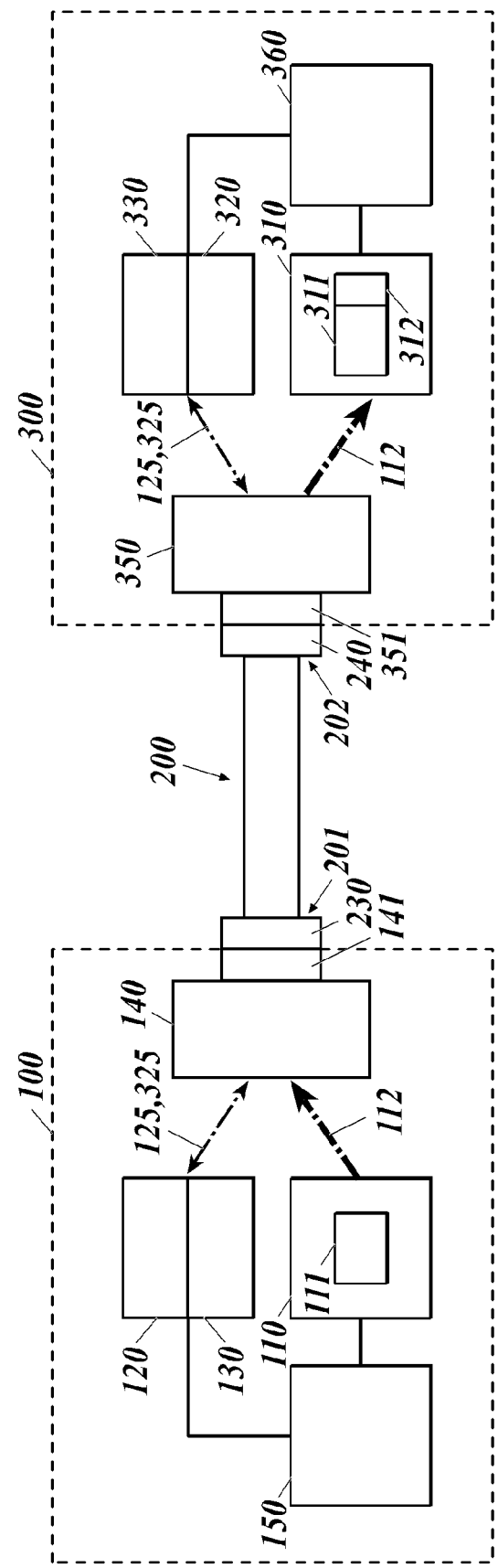
FIG. 5 is a block diagram of the power over fiber system according to the second embodiment of the present disclosure with a controller(s) (power-receiving-side controller and power-supplying-side controller) added.

The power over fiber system 1 shown in FIG. 5 includes: the first data communication device 100 including the power sourcing equipment 110; the second data communication device 300 including the powered device 310; and the optical fiber cable 200 for the first data communication device 100 and the second data communication device 300 to perform optical communication.

As shown in FIG. 5, the powered device 310 included in the second data communication device 300 includes a temperature sensor 312 that detects the temperature of the photoelectric conversion element 311.

The second data communication device 300 includes a power-receiving-side controller 360 that obtains temperature information on the temperature detected by the temperature sensor 312 for the process of switching the output level of the feed light 112.

The first data communication device 100 includes a power-supplying-side controller 150 that performs the process of switching the output level of the feed light 112 in accordance with the temperature information obtained by the power-receiving-side controller 360, the feed light 112 being output by the semiconductor laser 111.

The power-receiving-side controller 360 and the power-supplying-side controller 150 cooperate, thereby functioning as a controller(s) that performs a process of lowering the output level of the feed light 112 when the temperature detected by the temperature sensor 312 is equal to or higher than a predetermined threshold value, and performs a process of raising the output level of the feed light 112 when the temperature detected by the temperature sensor 312 is lower than the predetermined threshold value.

As the temperature used as the threshold value, a temperature suitable for the photoelectric conversion element 311 to efficiently convert the feed light 112 into electric power or a temperature at which the photoelectric conversion element 311 can convert the feed light 112 into electric power without overheating is set.

For example, the power-receiving-side controller 360 obtains the temperature information on the temperature detected by the temperature sensor 312, and performs a process of notifying the obtained temperature information to the power-supplying-side controller 150, and the power-supplying-side controller 150 determines whether to lower or raise the output level of the feed light 112 on the basis of the notified temperature information, and performs the process of switching the output level of the feed light 112.

More specifically, the power-receiving-side controller 360 outputs the obtained temperature information from the transmitter 320 as the signal light 325 to notify the temperature information to the power-supplying-side controller 150.

On the basis of the temperature information notified by the power-receiving-side controller 360, the power-supplying-side controller 150 performs the process of lowering the output level of the feed light 112 when the temperature of the photoelectric conversion element 311 detected by the temperature sensor 312 is equal to or higher than a predetermined threshold value, the feed light 112 being output by the semiconductor laser 111, and performs the process of raising the output level of the feed light 112 when the temperature of the photoelectric conversion element 311 detected by the temperature sensor 312 is lower than the predetermined threshold value, the feed light 112 being output by the semiconductor laser 111.

For example, the semiconductor laser 111 can output the PWM feed light 112 of various duty cycles under the control of the power-supplying-side controller 150, and outputs the feed light 112 having a low duty cycle to lower the output level of the feed light 112, and outputs the feed light 112 having a high duty cycle to raise the output level of the feed light 112.

It is assumed that the semiconductor laser 111 can switch the duty cycle of the feed light 112 between six levels of 0.0, 0.2, 0.4, 0.6, 0.8 and 1.0 to output the feed light 112, and the semiconductor laser 111 of the power sourcing equipment 110 is outputting the feed light 112 having a duty cycle of 0.6 to supply electric power to the second data communication device 300 including the powered device 310.

When the temperature of the photoelectric conversion element 311 detected by the temperature sensor 312 is equal to or higher than a predetermined threshold value, the semiconductor laser 111 switches the output level of the feed light 112 to output the feed light 112 having a duty cycle of 0.4, which is one lower output level.

When the temperature of the photoelectric conversion element 311 detected by the temperature sensor 312 is equal to or higher than the predetermined threshold value even after a predetermined time elapses, the semiconductor laser 111 lowers the output level by one more level, thereby switching the output level of the feed light 112 to output the feed light 112 having a duty cycle of 0.2.

On the other hand, when the temperature of the photoelectric conversion element 311 detected by the temperature sensor 312 is lower than the predetermined threshold value after the predetermined time elapses, the semiconductor laser 111 raises the output level of the feed light 112 by one level, thereby switching the output level of the feed light 112 to output the feed light 112 having a duty cycle of 0.6.

In the state in which the semiconductor laser 111 of the power sourcing equipment 110 is outputting the feed light 112 having a duty cycle of 0.6, when the temperature of the photoelectric conversion element 311 detected by the temperature sensor 312 is lower than the predetermined threshold value, the semiconductor laser 111 switches the output level of the feed light 112 to output the feed light 112 having a duty cycle of 0.8, which is one higher output level.

When the temperature of the photoelectric conversion element 311 detected by the temperature sensor 312 is lower than the predetermined threshold value even after the predetermined time elapses, the semiconductor laser 111 raises the output level by one more level, thereby switching the output level of the feed light 112 to output the feed light 112 having a duty cycle of 1.0.

On the other hand, when the temperature of the photoelectric conversion element 311 detected by the temperature sensor 312 is equal to or higher than the predetermined threshold value after the predetermined time elapses, the semiconductor laser 111 lowers the output level of the feed light 112 by one level, thereby switching the output level of the feed light 112 to output the feed light 112 having a duty cycle of 0.6.

Thus, when the temperature of the photoelectric conversion element 311 detected by the temperature sensor 312 is equal to or higher than a predetermined threshold value, the output level of the feed light 112 that is output by the semiconductor laser 111 is lowered, so that supply of the feed light 112 to the powered device 310 (photoelectric conversion element 311) can be curbed, whereas when the temperature of the photoelectric conversion element 311 detected by the temperature sensor 312 is lower than the predetermined threshold value, the output level of the feed light 112 that is output by the semiconductor laser 111 is raised, so that supply of the feed light 112 to the powered device 310 (photoelectric conversion element 311) can be performed aggressively.

Switching the output level of the feed light 112 according to the temperature of the photoelectric conversion element 311 detected by the temperature sensor 312, the feed light 112 being output by the semiconductor laser 111, makes the temperature of the photoelectric conversion element 311 hardly fluctuate, so that the temperature determined as the threshold value can be easily maintained.

That is, switching the output level of the feed light 112 according to the change in the temperature of the photoelectric conversion element 311 of the powered device 310, the feed light 112 being output by the semiconductor laser 111 of the power sourcing equipment 110, can curb excessive supply of the feed light 112, so that the photoelectric conversion element 311 does not generate high-temperature heat owing to excessive supply of the feed light 112, and energy loss, namely, electric energy supplied to the powered device 310 (photoelectric conversion element 311) as the feed light 112 being lost as heat, can be reduced.

In particular, maintaining the temperature of the photoelectric conversion element 311 at the temperature suitable for the photoelectric conversion element 311 to efficiently convert the feed light 112 into electric power achieves efficient supply of electric power from the power sourcing equipment 110 to the powered device 310.

Further, maintaining the temperature of the photoelectric conversion element 311 so as not to be too high can prevent damage to the photoelectric conversion element 311, such as overheating.

Although in the above embodiment, the power-supplying-side controller 150 determines on the basis of the temperature information notified by the power-receiving-side controller 360 whether to lower or raise the output level of the feed light 112 and performs the process of switching the output level of the feed light 112, the power-receiving-side controller 360 may determine on the basis of the temperature information whether to lower or raise the output level of the feed light 112.

That is, the power-receiving-side controller 360 determines on the basis of the obtained temperature information whether to lower or raise the output level of the feed light 112 and performs a process of notifying switching information on the determined output level to the power-supplying-side controller 150, and the power-supplying-side controller 150 performs the process of switching the output level of the feed light 112 on the basis of the notified switching information on the output level.

More specifically, the power-receiving-side controller 360 determines, on the basis of the obtained temperature information, to lower the output level of the feed light 112 when the temperature of the photoelectric conversion element 311 detected by the temperature sensor 312 is equal to or higher than a predetermined threshold value, or to raise the output level of the feed light 112 when the temperature of the photoelectric conversion element 311 detected by the temperature sensor 312 is lower than the predetermined threshold value, and outputs the switching information on the determined output level from the transmitter 320 as the signal light 325 to notify the switching information to the power-supplying-side controller 150.

The power-supplying-side controller 150 performs the process of lowering the output level of the feed light 112 that is output by the semiconductor laser 111 when the switching information on the output level notified by the power-receiving-side controller 360 is the switching information for lowering the output level of the feed light 112, and performs the process of raising the output level of the feed light 112 that is output by the semiconductor laser 111 when the switching information on the output level notified by the power-receiving-side controller 360 is the switching information for raising the output level of the feed light 112.

Under the control of the power-supplying-side controller 150, the semiconductor laser 111 outputs the feed light 112 having a low duty cycle to lower the output level of the feed light 112, and outputs the feed light 112 having a high duty cycle to raise the output level of the feed light 112.

Thus, even when the power-receiving-side controller 360 determines on the basis of the obtained temperature information whether to lower or raise the output level of the feed light 112, and the semiconductor laser 111 of the power sourcing equipment 110 switches the output level of the feed light 112 to output, this can curb excessive supply of the feed light 112, so that energy loss, namely, electric energy supplied to the powered device 310 (photoelectric conversion element 311) as the feed light 112 being lost as heat, can be reduced.

In the process of switching the output level of the feed light 112 described above, one borderline is set by a predetermined threshold value, and the output level of the feed light is switched to be lowered or raised on the basis of whether the temperature of the photoelectric conversion element 311 detected by the temperature sensor 312 exceeds the threshold value or not. However, instead of one borderline being set by a predetermined threshold value, two borderlines may be set by a threshold value as the upper limit and a threshold value as the lower limit.

In this case, the output level of the feed light 112 may be switched to be lowered when the temperature of the photoelectric conversion element 311 detected by the temperature sensor 312 is equal to or higher than the threshold value as the upper limit, and switched to be raised when the temperature of the photoelectric conversion element 311 detected by the temperature sensor 312 is lower than the threshold value as the lower limit.

Although some embodiments of the present disclosure have been described above, these embodiments are made for purposes of illustration and example only. The present invention can be carried out in various other forms, and each component may be omitted, replaced or modified/changed within a range not departing from the scope of the present invention.

INDUSTRIAL APPLICABILITY

The present invention is configured as described above and hence can be used as a power over fiber system.

REFERENCE SIGNS LIST

1A Power over Fiber System (Optical Power Supply System)
1 Power over Fiber System (Optical Power Supply System)
1B Power over Fiber System (Optical Power Supply System)
100 First Data Communication Device
110 Power Sourcing Equipment
111 Semiconductor Laser for Power Supply
112 Feed Light
120 Transmitter
125 Signal Light
130 Receiver
140 Light Input/Output Part
141 Optical Connector
150 Power-supplying-side Controller
200A Optical Fiber Cable
200 Optical Fiber Cable
200B Optical Fiber Cable
210 Core
220 Cladding
250A Optical Fiber
250 Optical Fiber
260 Optical Fiber
270 Optical Fiber
300 Second Data Communication Device
310 Powered Device
311 Photoelectric Conversion Element
312 Temperature Sensor
320 Transmitter
325 Signal Light
330 Receiver
350 Light Input/Output Part
351 Optical Connector
360 Power-receiving-side Controller

The invention claimed is:

1. A power over fiber system, comprising:
a power sourcing equipment including a semiconductor laser that oscillates with electric power, thereby outputting feed light;
a powered device including a photoelectric conversion element that converts the feed light from the power sourcing equipment into electric power;
an optical fiber cable that transmits the feed light from the power sourcing equipment to the powered device;
a temperature sensor that detects a temperature of the photoelectric conversion element; and
a controller that performs a process of lowering an output level of the feed light in response to the temperature detected by the temperature sensor being equal to or higher than a predetermined threshold value, and performs a process of raising the output level of the feed light in response to the temperature being lower than the predetermined threshold value,
wherein the power over fiber system comprises:
a first data communication device including the power sourcing equipment; and
a second data communication device including the powered device and performing optical communication with the first data communication device, and
wherein the controller includes:
a power-receiving-side controller that is included in the second data communication device and obtains temperature information on the temperature detected by the temperature sensor; and
a power-supplying-side controller that is included in the first data communication device and performs a process of, in accordance with the temperature information obtained by the power-receiving-side controller, switching the output level of the feed light that is output by the semiconductor laser.

2. The power over fiber system according to claim 1, wherein the power-receiving-side controller performs a process of notifying the temperature information to the power-supplying-side controller by the optical communication, and
wherein the power-supplying-side controller determines whether to lower or raise the output level of the feed light based on the notified temperature information, and performs the process of switching the output level of the feed light.

3. The power over fiber system according to claim 2, wherein a semiconductor material of a semiconductor region of the semiconductor laser is a laser medium having a laser wavelength of 500 nm or less, the semiconductor region exhibiting a light-electricity conversion effect.

4. The power over fiber system according to claim 3, wherein a semiconductor material of a semiconductor region of the photoelectric conversion element is a laser medium having a laser wavelength of 500 nm or less, the semiconductor region exhibiting a light-electricity conversion effect.

5. The power over fiber system according to claim 2, wherein a semiconductor material of a semiconductor region of the photoelectric conversion element is a laser medium having a laser wavelength of 500 nm or less, the semiconductor region exhibiting a light-electricity conversion effect.

6. The power over fiber system according to claim 1,
wherein the power-receiving-side controller determines whether to lower or raise the output level of the feed light based on the temperature information, and performs a process of notifying switching information on the determined output level to the power-supplying-side controller, and
wherein the power-supplying-side controller performs the process of switching the output level of the feed light based on the notified switching information on the output level.

7. The power over fiber system according to claim 6, wherein a semiconductor material of a semiconductor region of the semiconductor laser is a laser medium having a laser wavelength of 500 nm or less, the semiconductor region exhibiting a light-electricity conversion effect.

8. The power over fiber system according to claim 7, wherein a semiconductor material of a semiconductor region of the photoelectric conversion element is a laser medium having a laser wavelength of 500 nm or less, the semiconductor region exhibiting a light-electricity conversion effect.

9. The power over fiber system according to claim 6, wherein a semiconductor material of a semiconductor region of the photoelectric conversion element is a laser medium having a laser wavelength of 500 nm or less, the semiconductor region exhibiting a light-electricity conversion effect.

10. The power over fiber system according to claim 1, wherein a semiconductor material of a semiconductor region of the semiconductor laser is a laser medium having a laser wavelength of 500 nm or less, the semiconductor region exhibiting a light-electricity conversion effect.

11. The power over fiber system according to claim 10, wherein a semiconductor material of a semiconductor region of the photoelectric conversion element is a laser medium having a laser wavelength of 500 nm or less, the semiconductor region exhibiting a light-electricity conversion effect.

12. The power over fiber system according to claim 1, wherein a semiconductor material of a semiconductor region of the photoelectric conversion element is a laser medium having a laser wavelength of 500 nm or less, the semiconductor region exhibiting a light-electricity conversion effect.

\* \* \* \* \*